(12) United States Patent
Ngo et al.

(10) Patent No.: US 7,060,571 B1
(45) Date of Patent: Jun. 13, 2006

(54) SEMICONDUCTOR DEVICE WITH METAL GATE AND HIGH-K TANTALUM OXIDE OR TANTALUM OXYNITRIDE GATE DIELECTRIC

(75) Inventors: Minh Van Ngo, Fremont, CA (US); Christy Woo, Cupertino, CA (US); James Pan, Fishkill, NY (US); Paul R. Besser, Sunnyvale, CA (US); Jinsong Yin, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 148 days.

(21) Appl. No.: 10/777,138

(22) Filed: Feb. 13, 2004

(51) Int. Cl.
*H01L 21/336* (2006.01)
(52) U.S. Cl. ...................... 438/287; 438/785
(58) Field of Classification Search ...................... None
See application file for complete search history.

(56) References Cited

U.S. PATENT DOCUMENTS

| | | | |
|---|---|---|---|
| 6,020,024 A * | 2/2000 | Maiti et al. ................. | 438/287 |
| 6,225,168 B1 * | 5/2001 | Gardner et al. ............. | 438/287 |
| 6,372,659 B1 * | 4/2002 | Yu .............................. | 438/766 |
| 6,476,454 B1 * | 11/2002 | Suguro ........................ | 257/410 |

* cited by examiner

*Primary Examiner*—Chandra Chaudhari

(57) ABSTRACT

Microminiaturized semiconductor devices are fabricated with a replacement metal gate and a high-k tantalum oxide or tantalum oxynitride gate dielectric with significantly reduced carbon. Embodiments include forming an opening in a dielectric layer by removing a removable gate, depositing a thin tantalum film, as by PVD at a thickness of 25 Å to 60 Å lining the opening, and then conducting thermal oxidation, as at a temperature of 100° C. to 500° C., in flowing oxygen or ozone to form a high-k tantalum oxide gate dielectric layer, or in oxygen and $N_2O$ or ozone and $N_2O$ ammonia to form a high-k tantalum oxynitride gate dielectric. Alternatively, oxidation can be conducted in an oxygen or ozone plasma to form the high-k tantalum oxide layer, or in a plasma containing $N_2O$ and oxygen or ozone to form the high-k tantalum oxynitride gate dielectric layer.

18 Claims, 9 Drawing Sheets

SEMICONDUCTOR DEVICE WITH METAL GATE AND HIGH-K TANTALUM OXIDE OR TANTALUM OXYNITRIDE GATE DIELECTRIC

FIELD OF THE INVENTION

The present invention relates to the fabrication of semiconductor devices comprising transistors with metal gate electrodes and high dielectric constant (k) gate dielectric layers exhibiting reduced leakage and improved thermal stability. The present invention is particularly applicable to fabricaturing high speed semiconductor devices having submicron design features.

BACKGROUND ART

The integration of hundreds of millions of circuit elements, such as transistors, on a single integrated circuit necessitates further dramatic scaling down or micro-miniaturization of the physical dimensions of circuit elements, including interconnection structures. Micro-miniaturization has engendered a dramatic increase in transistor engineering complexity, such as the inclusion of graded well-doping, epitaxial wafers, halo implants, tip implants, lightly doped drain structures, multiple implants for source/drain regions, silicidation of gates and source/drains, and multiple sidewall spacers.

The drive for high performance requires high speed operation of microelectronic components requiring high drive currents in addition to low leakage, i.e., low off-state current, to reduce power consumption. Typically, the structural and doping parameters tending to provide a desired increase in drive current adversely impact leakage current.

As device geometries continue to plunge into the deep submicron regime, it is necessary to reduce the polysilicon depletion. Conventional approaches comprise replacing the high resistivity polysilicon gate with a metal gate or replacing the gate dielectric with a high-k material, such as a tantalum oxide, e.g., $Ta_2O_5$, or tantalum oxynitride (TaON). Conventional tantalum oxide deposition techniques include metal oxide chemical vapor deposition (MOCVD) or atomic layer deposition (ALD) techniques. Such attempts are plagued with several disadvantages. For example, chemical vapor deposition (CVD) techniques generate a high carbon content within the deposited film. Carbon is believed to be a major source for leakage and thermal instability. Replacement of conventional CVD or ALD deposition tools is very costly.

Accordingly, there exists a need for methodology enabling the fabrication of semiconductor devices having replacement metal gates and high-k dielectric layers with reduced carbon and, hence, reduced leakage and reduced thermal instability. There exists a particular need for such methodology without resorting to expensive replacement tools.

DISCLOSURE OF THE INVENTION

An advantage of the present invention is a method of manufacturing a semiconductor device comprising a transistor with a replacement metal gate and high-k gate dielectric layer exhibiting reduced leakage current and reduced thermal instability.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a removable gate over a substrate with a gate dielectric layer therebetween; forming a dielectric layer over the substrate and exposing an upper surface of the removable gate; removing the removable gate leaving an opening in the dielectric layer; depositing a layer of tantalum (Ta) lining the opening; heating in an oxidizing atmosphere to convert the Ta layer into a high-k gate dielectric layer; and depositing a metal to fill the opening.

Embodiments of the present invention comprise depositing the Ta layer by physical vapor deposition (PVD) at a thickness of 25 Å to 60 Å. Embodiments of the present invention further include oxidizing the Ta layer in flowing oxygen or flowing ozone to form a high-k tantalum oxide gate dielectric layer, or in flowing oxygen or flowing ozone with flowing $N_2O$ to form a high-k tantalum oxynitride layer. Alternatively, oxidation can be effected in a plasma containing oxygen or ozone to form the high-k tantalum oxide gate dielectric layer, or in a plasma containing $N_2O$ and oxygen or ozone to form the high-k tantalum oxynitride layer. Annealing may optionally be conducted in an ammonia plasma subsequent to oxidation to form the high-k gate dielectric layer. A metal is then deposited filling the opening and planarization is implemented, as by chemical mechanical polishing (CMP), such that the upper surface of the metal filling the opening is substantially coplanar with an upper surface of the dielectric layer, thereby completing formation of the replacement metal gate electrode. Alternate embodiments include removing the gate dielectric layer before depositing the Ta layer.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modification in various obvious respects, all without departing from the present invention. Accordingly, the drawings and description are to be regarded as illustrative in nature, and not as restrictive.

BRIEF DESCRIPTION OF DRAWINGS

In FIGS. 1 through 9, similar features are denoted by similar reference characters.

DESCRIPTION OF THE INVENTION

The present invention address and solves problems attendant upon conventional semiconductor devices comprising polysilicon gate electrodes having high resistivity and, hence, slow operating speed. The present invention also addresses and solves problems attendant upon conventional replacement metal gate methodology and conventional techniques employed to form high-k gate dielectric layers for use with replacement metal gates. The present invention addresses and solves such problems by providing methodology enabling the fabrication of transistors with a replacement metal gate electrode and a high-k gate dielectric layer, such as a high-k tantalum oxide or tantalum oxynitride gate dielectric layer, having significantly reduced carbon and, hence, significantly reduced leakage and significantly reduced thermal instability.

In accordance with embodiments of the present invention, a removable gate electrode is removed and a thin layer of Ta is deposited by a conventional PVD technique, as at a thickness of 25 Å to 60 Å. Subsequently, the deposited Ta layer is converted to a high-k gate dielectric layer, such as tantalum oxide or tantalum oxynitride, in an appropriate atmosphere. As used throughout this disclosure, the expression "high-k" is intended to denote a dielectric constant greater than five, with (1) one being the dielectric constant of a vacuum.

Figure 1:
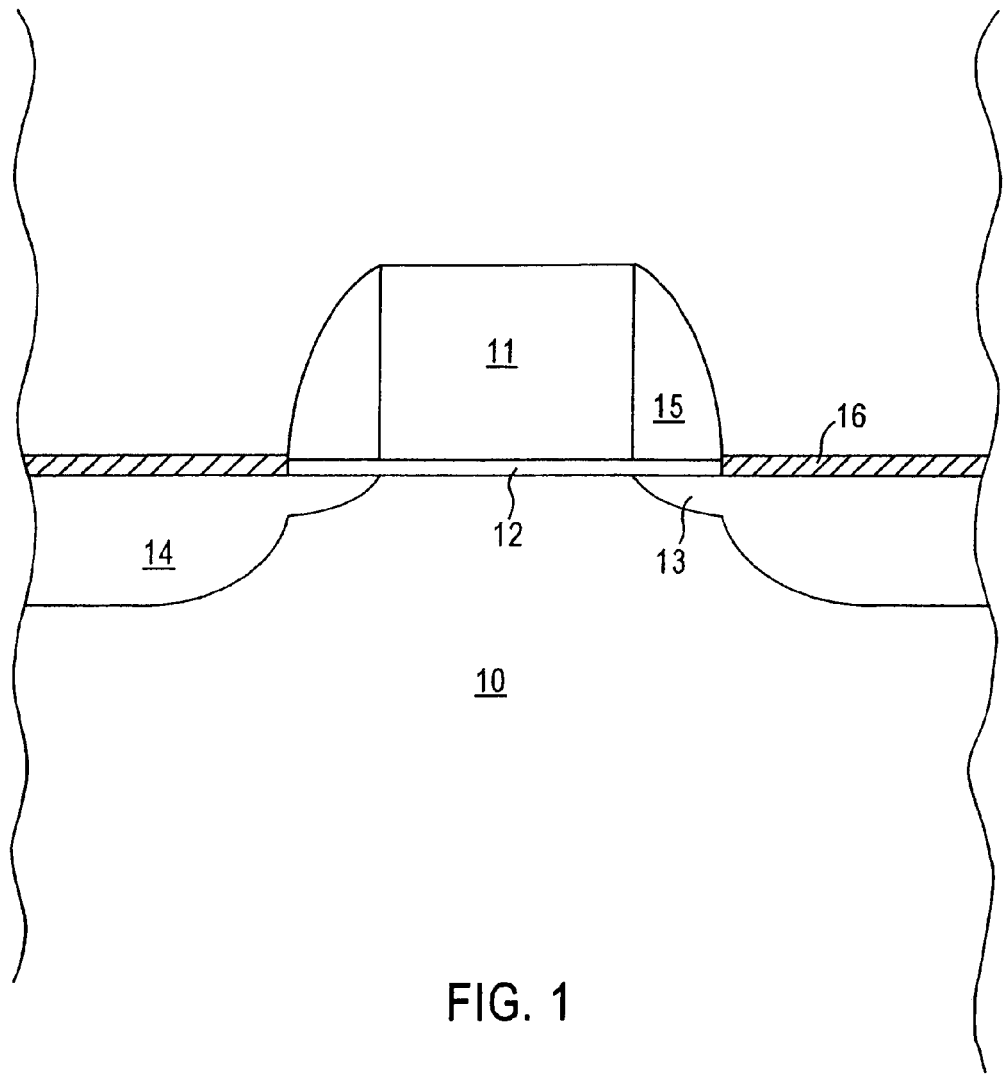
FIGS. 1 through 8 schematically illustrate sequential phases of a method in accordance with an embodiment of the present invention.

An embodiment of the present invention is schematically illustrated in FIGS. 1 through 8. Adverting to FIG. 1, a temporary replaceable or dummy gate 11, such as polysilicon, is formed over substrate 10 with a gate dielectric layer 12 therebetween, such as silicon oxide at a thickness of 10 Å to 50 Å by thermal oxidation. Shallow source/drain extensions 13 are then formed, and dielectric sidewall spacers 15, such as silicon oxide, silicon nitride or silicon oxynitride, are then formed on the removable gate 11. Ion implantation is then conducted to form deep source/drain regions 14, followed by silicidation to form metal silicide layer 16 on the exposed surfaces of the source/drain regions 14, such as nickel silicide. The manipulative steps illustrated in FIG. 1 are implemented in a conventional manner.

Figure 2:
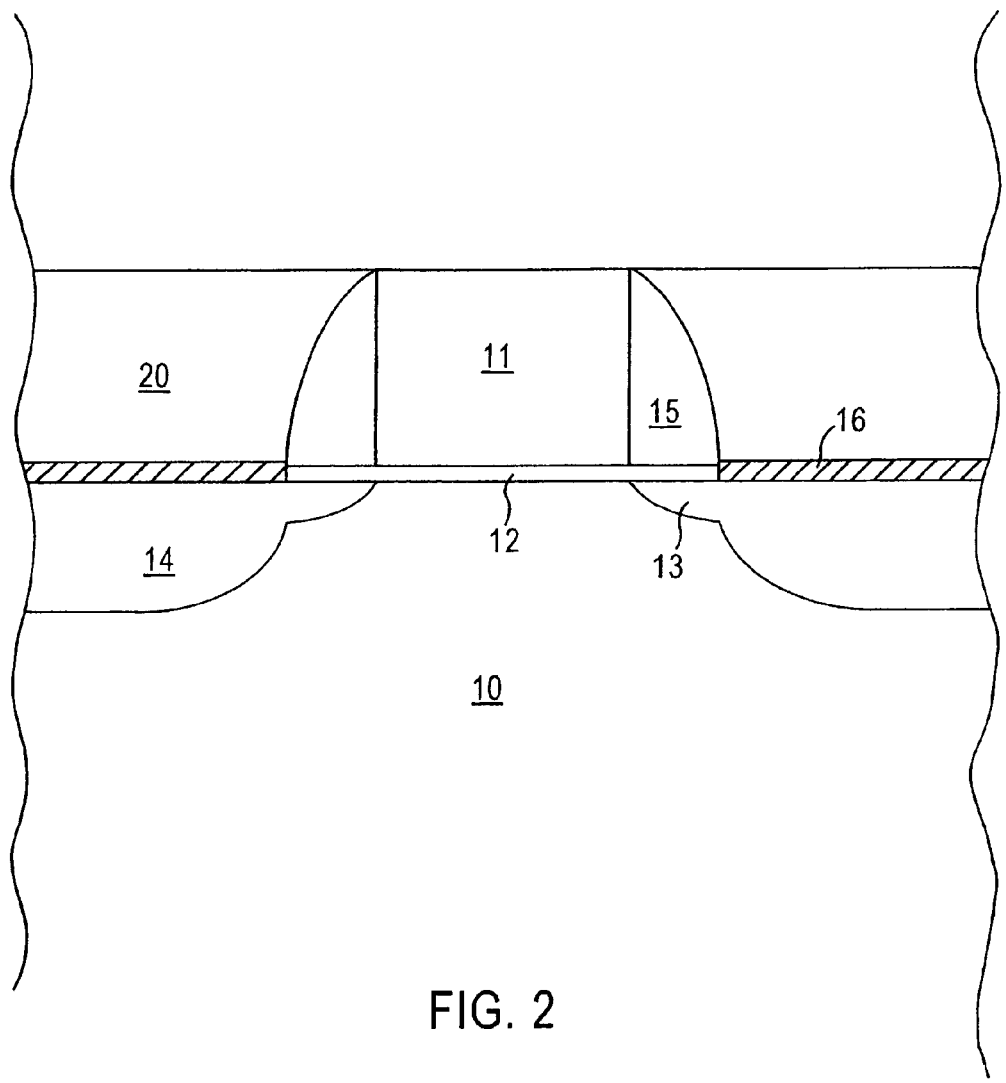

Adverting to FIG. 2, a layer of dielectric material, such as silicon oxide, e.g., silicon oxide formed from tetraethyl orthosilicate (TEOS), is deposited followed by chemical mechanical polishing (CMP) forming layer 20. It should be understood that shallow source/drain extensions 13 and source/drain regions 14 are activated by high temperature thermal annealing, such as at a temperature of about 900° C. and above, at the stage illustrated in FIG. 1 or, alternatively, FIG. 2 or, alternatively, even at the stage illustrated in FIG. 3, prior to depositing the replacement metal gate electrode.

Figure 3:
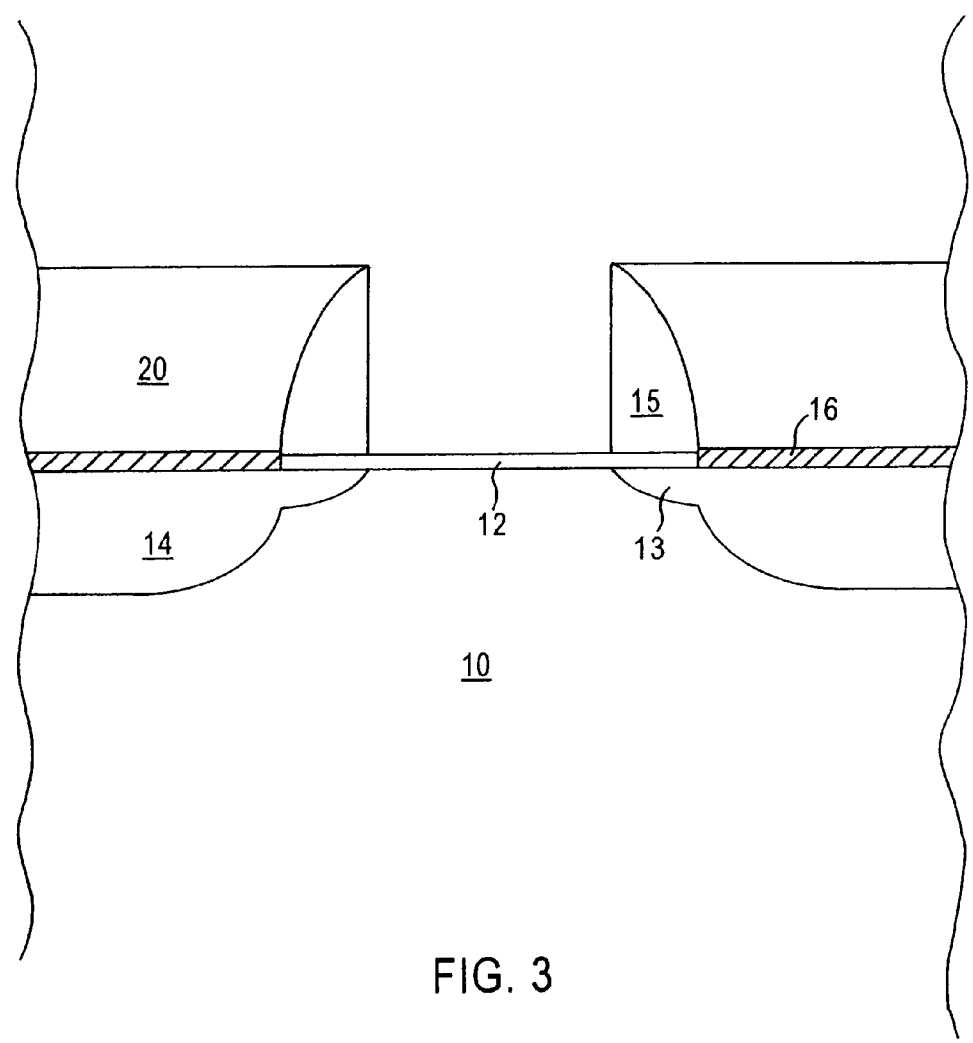
Figure 4:
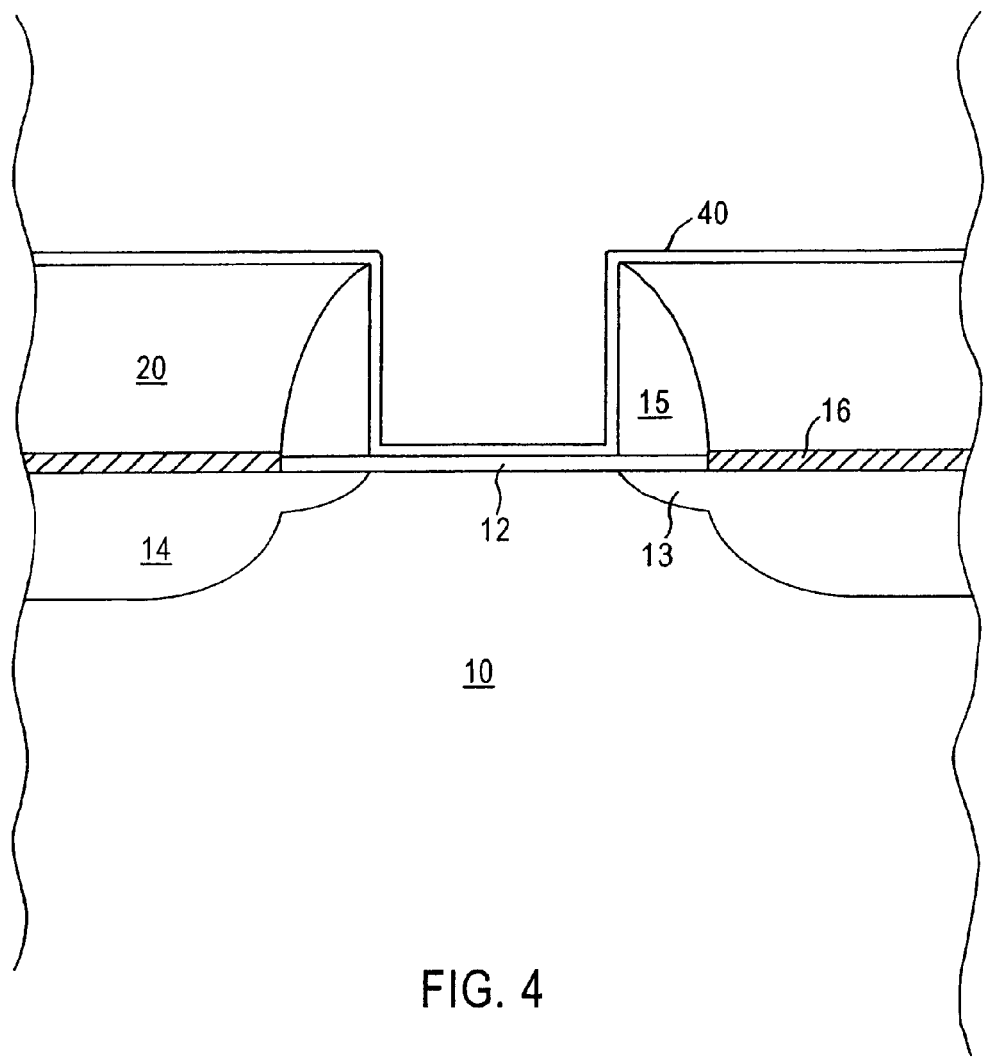
Figure 5:
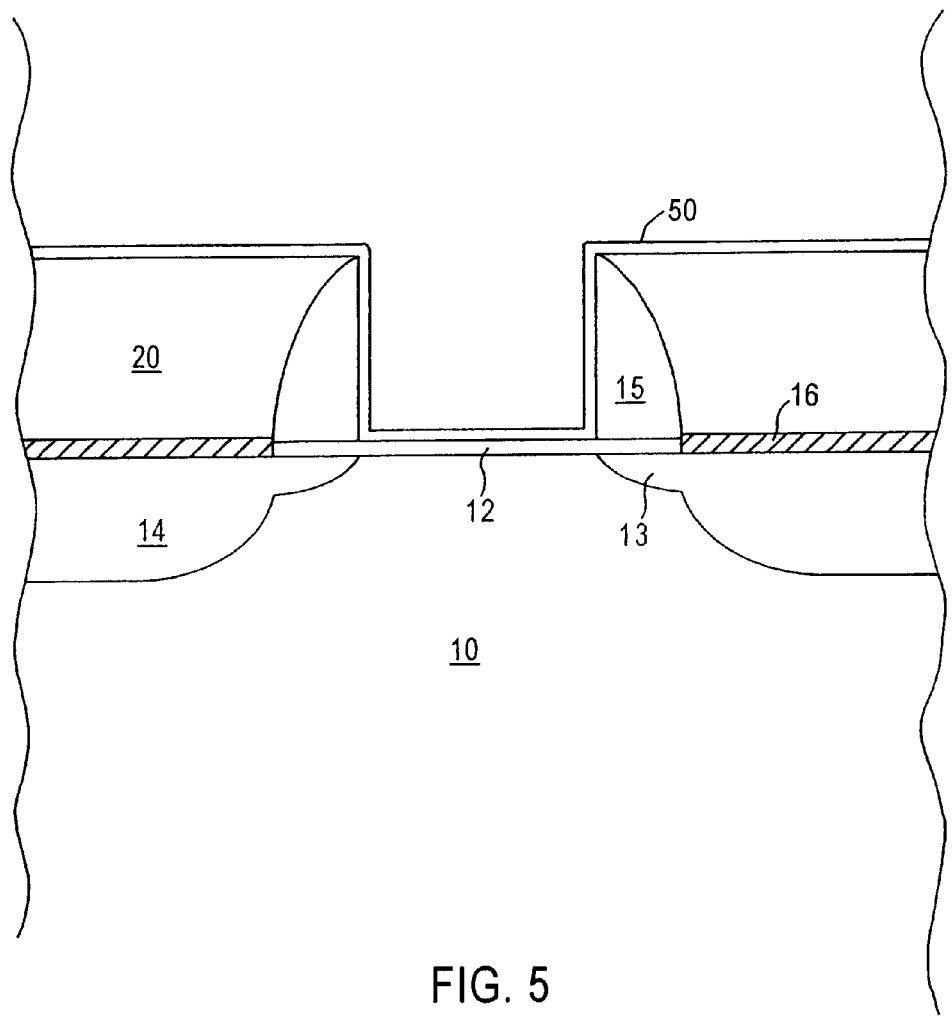

As illustrated in FIG. 3, replacement or dummy gate 11 is removed, as by etching, e.g., using a solution of hydrofluoric acid and nitric acid in acetic acid. In accordance with aspects of this embodiment, a layer of Ta of 40 is deposited, as by PVD, as at a thickness of 25 Å to 60 Å, lining the opening and on the upper surface of dielectric layer 20, as illustrated in FIG. 4. Subsequently, Ta layer 40 is converted into a high-k gate dielectric layer 50, shown in FIG. 5. Embodiments of the present invention include oxidizing the Ta film in an oxygen and $N_2O$ ambient, or in an ozone and $N_2O$ ambient. Oxidation is conducted at a suitable temperature, as from 100° C. to 500° C. Lower temperatures may be employed; however, longer times would be required. Oxidation may be implemented in flowing oxygen or ozone, or in flowing $N_2O$, in a heated process chamber. Alternatively, oxidation may be implemented employing a plasma containing oxygen or ozone, or in a plasma containing oxygen or ozone and $N_2O$. The resulting gate dielectric layer is either tantalum oxide, e.g., $Ta_2O_5$, or tantalum oxynitride, having substantially no carbon, e.g., a zero carbon content vis-a-vis layers produced by conventional CVD or ALD techniques, thereby significantly reducing leakage and significantly reducing thermal instability of the high-k gate dielectric layer. The deposited tantalum oxide or tantalum oxynitride layer may be annealed employing a $NH_3$ plasma.

Figure 6:
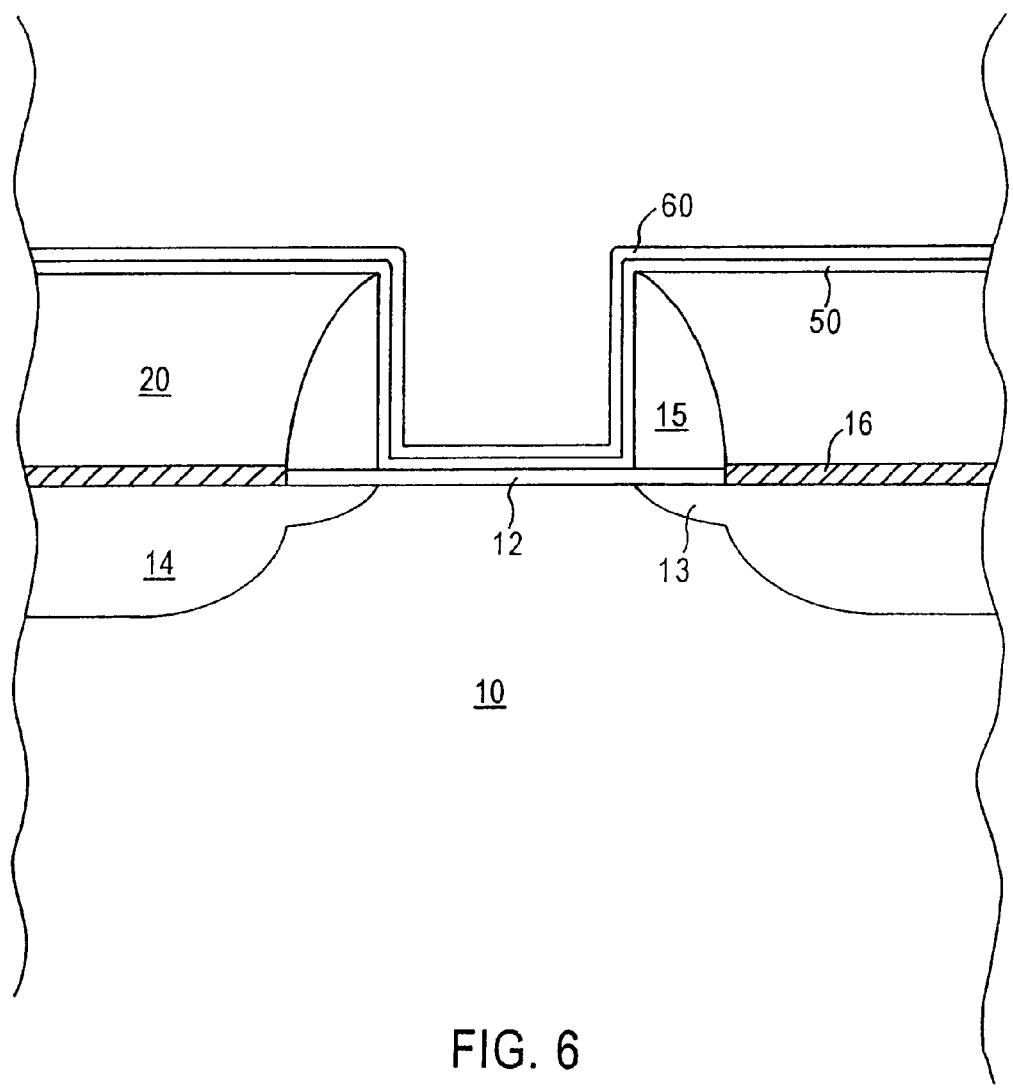

Subsequently, as illustrated in FIG. 6, a first metal layer 60 is deposited employing conventional deposition techniques, such as PVD, CVD or ALD. For example, in fabricating an MOS transistor, layer 60 may make may be tantalum or tantalum nitride. In fabricating a PMOS transistor, layer 60 may be ruthenium (Ru).

Figure 7:
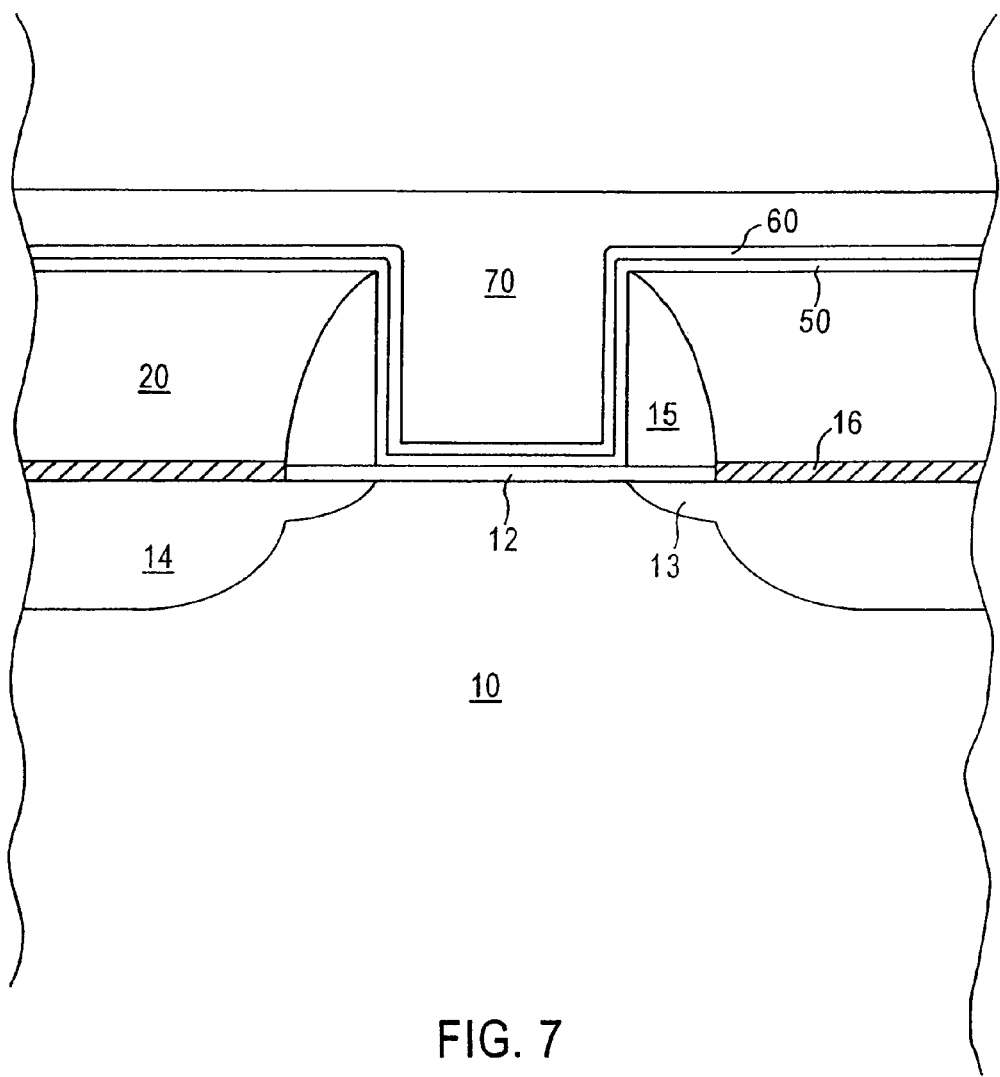
Figure 8:
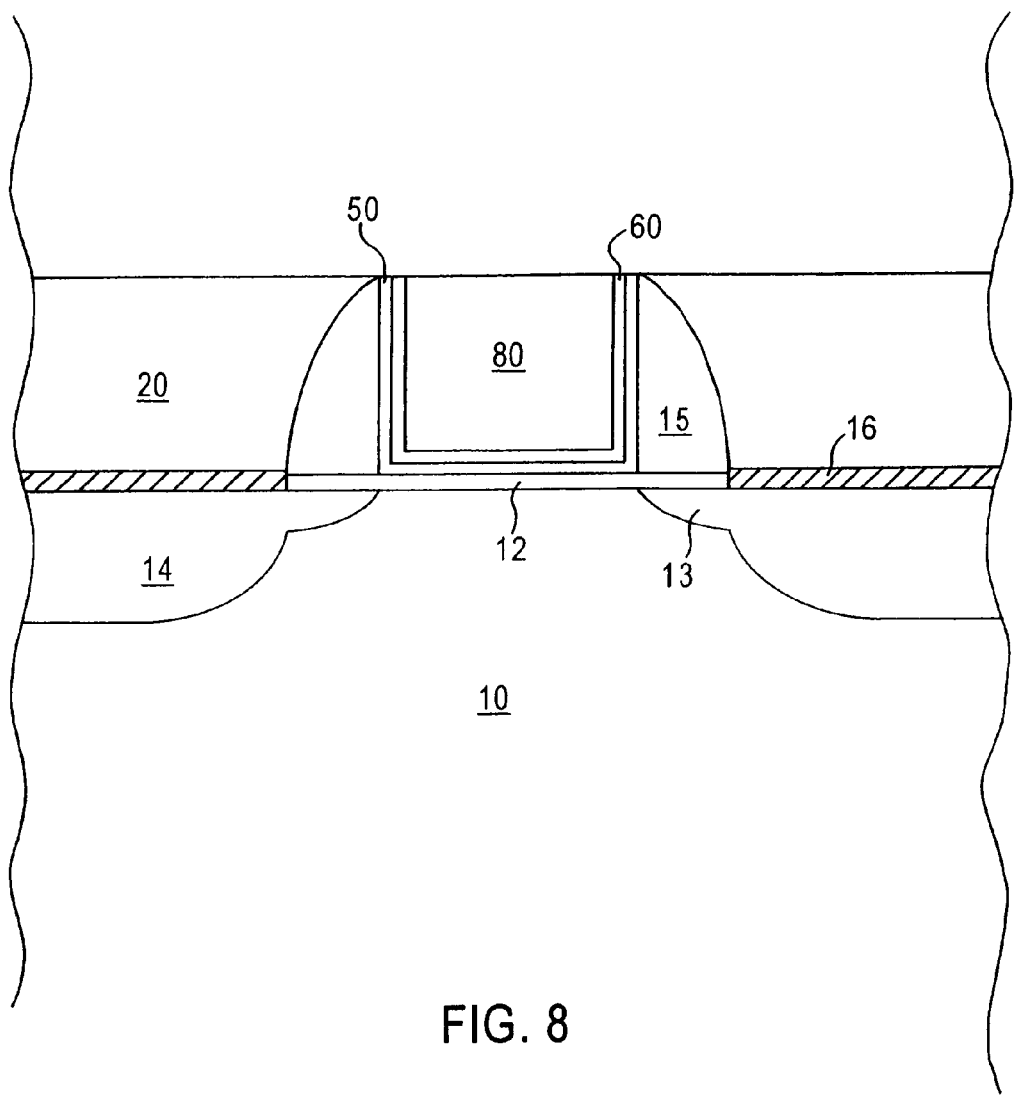

Subsequently, metal 70 is deposited to fill the opening, such as tantalum or copper (Cu), as shown in FIG. 7. Planarization is implemented, as by CMP, to form the replacement metal gate electrode comprising layer 60 and layer 80 on high-k dielectric layer 50 comprising a tantalum oxide having a dielectric constant (k) of 25 to 26, or tantalum oxynitride layer having a dielectric constant (k) significantly greater than 25, as shows in FIG. 8.

Figure 9:
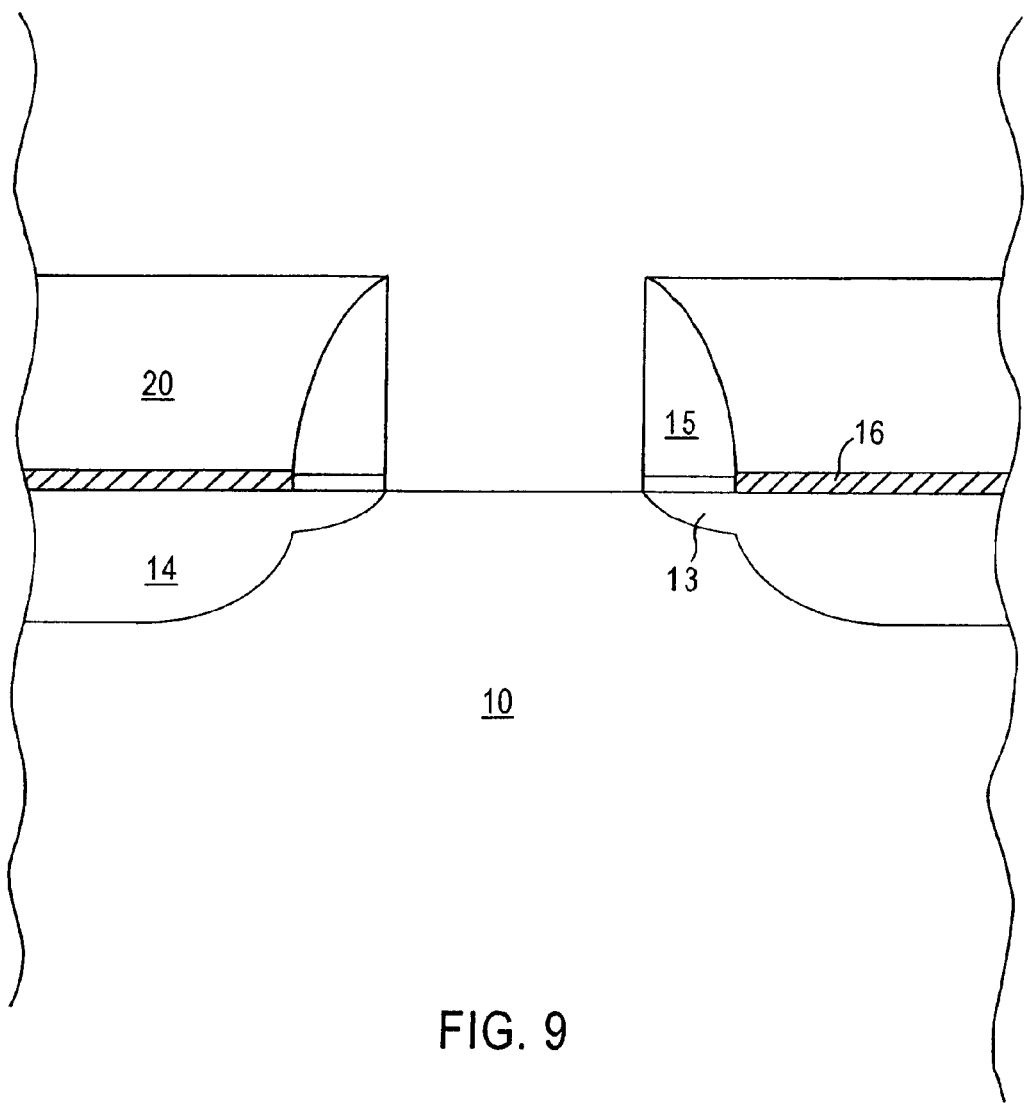
FIG. 9 schematically illustrates another embodiment of the present invention.

In an alternate embodiment of the present invention, the initial gate oxide layer 12 is removed, e.g., by wet etching with a dilute solution of hydrofluoric acid (HF) buffered with ammonium fluoride ($NH_4F$), as shown in FIG. 9. Subsequently, the manipulative steps illustrated in FIGS. 4 through 8 are implemented.

The present invention provides methodology enabling fabrication of semiconductor devices having transistors with replacement metal gates and high-k gate dielectric layers exhibiting reduced leakage and reduced thermal instability. The present invention provides enabling methodology without resorting to expensive replacement tools for conventional deposition techniques. The present invention enables the use of a conventional PVD system to deposit an initial thin Ta layer which is then converted to a high-k dielectric layer having significantly reduced carbon vis-a-vis conventional CVD and ALD techniques, thereby enabling a reduction in leakage current and a reduction in thermal instability.

The present invention enjoys industrial applicability in the fabrication of various types of semiconductor devices. The present invention is particularly applicable in fabricating semiconductor devices having submicron features and exhibiting a high drive current and minimized leakage current.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present application. It is to be understood that the present invention is capable of use in various other combinations and environments, and is capable of changes or modifications within the scope of the inventive concept as expressed herein.

What is claimed is:

1. A method of manufacturing a semiconductor device, the method comprising:

forming a removable gate over a substrate with a gate dielectric layer therebetween;

forming dielectric sidewall spacers on side surfaces of the removable gate;

forming a dielectric layer over the substrate and exposing an upper surface of the removable gate;

removing the removable gate leaving an opening in the dielectric layer, the opening defined by exposed side surfaces of the dielectric sidewall spacers and a bottom;

depositing a layer of tantalum (Ta) lining the opening;

heating in an oxidizing atmosphere to convert the Ta layer into a high-k gate dielectric layer; and depositing a metal to fill the opening.

2. The method according to claim 1, comprising depositing the Ta layer by physical vapor deposition (PVD) to line the opening, including the exposed side surfaces of the dielectric sidewall spacers.

3. The method according to claim 2, comprising depositing the Ta layer at a thickness of 25 Å to 60 Å.

4. The method according claim 1, comprising heating in an atmosphere of flowing oxygen or flowing ozone to form a high-k tantalum oxide gate dielectric layer.

5. The method according to claim 4, comprising depositing the Ta layer by physical vapor deposition (PVD).

6. The method according to claim 5, comprising depositing the Ta layer at a thickness of 25 Å to 60 Å.

7. The method according to claim 1, comprising heating in an atmosphere of flowing oxygen and $N_2O$ or flowing ozone and $N_2O$ to form a high-k tantalum oxynitride gate dielectric layer.

8. The method according to claim 7, comprising depositing the Ta layer by physical vapor deposition (PVD).

9. The method according to claim 8, comprising depositing the Ta layer at a thickness of 25 Å to 60 Å.

10. The method according to claim 1, comprising heating the Ta layer in an oxygen or ozone plasma to form a high-k tantalum oxide gate dielectric layer.

11. The method according to claim 10, comprising depositing the Ta layer by physical vapor deposition (PVD).

12. The method according to claim 11, comprising depositing the Ta layer at a thickness of 25 Å to 60 Å.

13. The method according to claim 1, comprising heating in a plasma containing oxygen and $N_2O$ or ozone and $N_2O$ to form a high-k tantalum oxynitride gate dielectric layer.

14. The method according to claim 13, comprising depositing the Ta layer by physical vapor deposition (PVD).

15. The method according to claim 14, comprising depositing the Ta layer at a thickness of 25 Å to 60 Å.

16. The method according to claim 1, comprising planarizing by chemical mechanical polishing (CMP) such that an upper surface of the metal filling the opening is substantially coplanar with an upper surface of the dielectric layer, and leaving the high-k gate dielectric layer on the side surfaces of the dielectric sidewall spacers.

17. The method according to claim 1, comprising annealing in a plasma containing ammonia after oxidizing to form the high-k dielectric layer.

18. The method according to claim 1, comprising removing the gate dielectric layer before depositing the Ta layer.

* * * * *